(12) United States Patent
Yoshikawa et al.

(10) Patent No.: US 8,278,682 B2
(45) Date of Patent: Oct. 2, 2012

(54) SEMICONDUCTOR DEVICE

(75) Inventors: Koh Yoshikawa, Matsumoto (JP); Kenichi Iguchi, Matsumoto (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 13/116,650

(22) Filed: May 26, 2011

(65) Prior Publication Data

US 2011/0291241 A1    Dec. 1, 2011

(30) Foreign Application Priority Data

May 27, 2010  (JP) ................. 2010-121618

(51) Int. Cl.
  *H01L 29/74* (2006.01)
  *H01L 31/111* (2006.01)

(52) U.S. Cl. ........ 257/139; 257/133; 257/262; 257/327; 438/133; 438/197

(58) Field of Classification Search ........ 257/133, 257/139, 262, 327, E29.002; 438/133, 197
See application file for complete search history.

(56) References Cited

U.S. PATENT DOCUMENTS 5,766,966 A * 6/1998 Ng ........................ 438/138
6,110,763 A * 8/2000 Temple ................... 438/133

FOREIGN PATENT DOCUMENTS

| JP | 2004-336008 | 11/2004 |
|----|-------------|---------|
| JP | 2005-101254 | 4/2005 |
| JP | 2005-252212 | 9/2005 |
| JP | 2006-319218 | 11/2006 |
| JP | 2009-187994 | 8/2009 |

* cited by examiner

*Primary Examiner* — Theresa T Doan (57) ABSTRACT

A semiconductor device that has a reduced size and exhibits a superior blocking voltage capability. A semiconductor device includes an edge termination structure between an active region and an isolation region, the edge termination structure being composed of an edge termination structure for a forward bias section and an edge termination structure for a reverse bias section. A plurality of field limiting rings (FLRs) and a plurality of field plates (FPs) are provided in the edge termination structure for the forward bias section and the edge termination structure for the reverse bias section. A first forward FP that is the nearest of the plurality of FPs to the edge termination structure for the reverse bias section is formed to extend towards the isolation region side. A first reverse FP that is the nearest of the plurality of FPs to the edge termination structure for the forward bias section is formed to extend towards the active region side. The first reverse FP stops the depletion layer expanding from the active region on application of a forward voltage. The first forward FP stops the depletion layer expanding from the isolation region on application of a reverse voltage.

20 Claims, 5 Drawing Sheets

SEMICONDUCTOR DEVICE

CROSS-REFERENCE TO RELATED APPLICATION

This application is based on, and claims priority to, Japanese Patent Application No. 2010-121618, filed on May 27, 2010, the contents of which are incorporated herein by reference.

BACKGROUND

1. Field

The present invention relates to a semiconductor device.

2. Description of the Related Art

In recent years, power conversion apparatuses using semiconductor devices, direct conversion circuits, for example matrix converters, are known, which can eliminate a DC smoothing circuit composed of an electrolytic capacitor and a DC reactor in AC/AC conversion, AC/DC conversion, or DC/AC conversion (AC stands for alternating current and DC stands for alternating current). A matrix convertor is composed of a plurality of AC switches. The AC switch, which is imposed by an AC voltage, needs a construction ensuring certain magnitude of bias blocking capabilities in both forward and reverse directions (a forward bias blocking capability and a reverse bias blocking capability). Thus, bidirectional switching devices are attracting attention from the viewpoint of improvements in size, weight, efficiency, response time, and cost of a circuit. A type of known bidirectional switching device is composed of two antiparallel-connected reverse blocking IGBTs (insulated gate bipolar transistors).

A reverse blocking IGBT includes an active region having an IGBT construction and an isolation region formed at a peripheral edge of a semiconductor substrate and across the substrate from one principal surface to the other principal surface. An edge termination structure is provided between the active region and the isolation region for mitigating electric field strength at a pn junction composing the IGBT construction to ensure a desired withstand voltage. A voltage withstanding structure includes field limiting rings (hereinafter abbreviated to FLRs) of floating p type regions, for example, and field plates (hereinafter abbreviated to FPs) that are conductive films electrically connected with the FLRs.

Japanese Unexamined Patent Application Publication No. 2004-336008 discloses a reverse blocking IGBT with a substrate thickness of not larger than 150 μm, the IGBT comprising an isolation diffusion region formed utilizing a trench for forming an isolation region in the first principal surface side.

Japanese Unexamined Patent Application Publication No. 2005-101254 discloses another device in which at least conductive field plates on the innermost field insulation film and the next outer field insulation film extend towards outer circumference, and at least conductive field plates on the outermost field insulation film and the next inner field insulation film extend towards inner circumference.

It is known that an edge termination structure of a reverse blocking IGBT comprises an edge termination structure for forward bias section for ensuring a forward bias blocking capability and an edge termination structure for reverse bias section for ensuring a reverse bias blocking capability.

Figure 5:
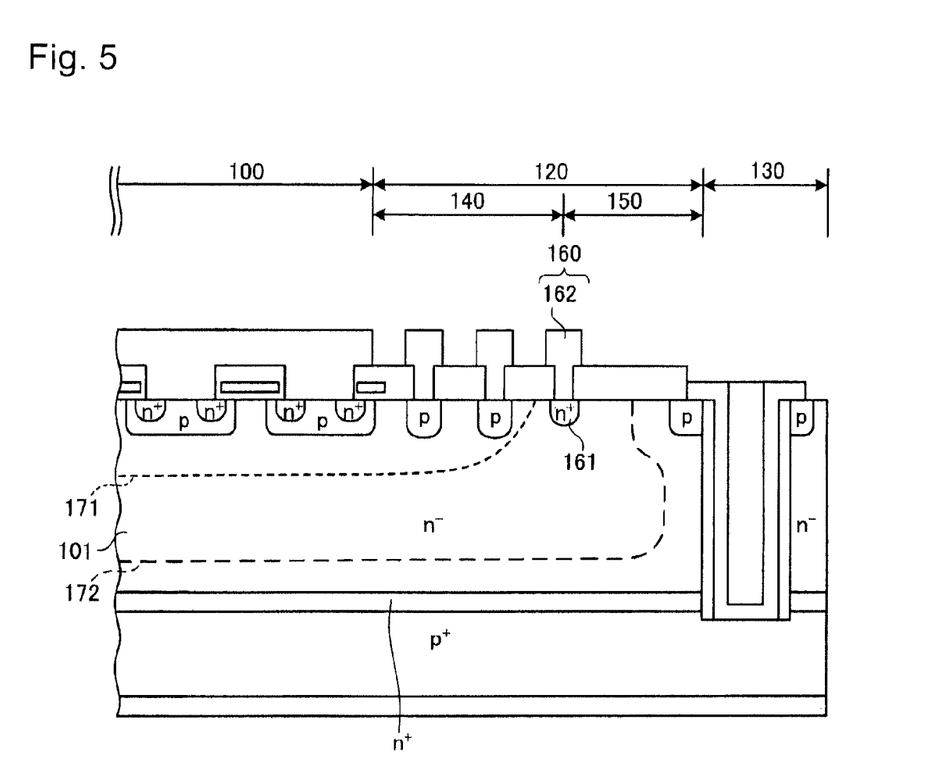
FIG. 5 is a sectional view of a voltage withstanding structure of a conventional reverse blocking IGBT.

FIG. 5 is a sectional view of an edge termination structure of a conventional reverse blocking IGBT. Referring to FIG. 5, the edge termination structure 120 of the reverse blocking IGBT comprises an edge termination structure for forward bias section 140 in the side of an active region 100, and an edge termination structure for reverse bias section 150 in the side of an isolation region 130. At the boundary between the edge termination structure for forward bias section 140 and the edge termination structure for reverse bias section 150, an intermediate channel stopper part 160 is provided that is a region not depleted on application of either forward voltage or reverse voltage. The intermediate channel stopper part 160 can consist of an $n^+$ channel stopper region 161 formed in a surface region of an $n^-$ drift region 101 and a FP 162 in electrical connection with the $n^+$ channel stopper region 161.

In this specification and accompanying drawings, a layer or region that are preceded by n or p means that majority carriers are electrons or positive holes, respectively, in that region. The signs "+" or "−" added to the n or p means that a layer or a region with the sign contains higher or lower concentration of impurities, respectively, than a layer or a region without the sign.

Japanese Unexamined Patent Application Publication No. 2006-319218 discloses a reverse blocking IGBT having an intermediate channel stopper part. This reverse blocking IGBT is provided with a trench at outer peripheral region of a semiconductor substrate for the IGBT, the substrate comprising a $p^+$ type collector region, an $n^-$ type base region, a p type base region, and an $n^+$ type emitter region. The trench is formed passing through the $n^-$ type base region reaching the $p^+$ type collector region. A conductor layer is formed on the surface of the trench via a dielectric layer opposing the side wall of the $n^-$ base region and in connection with the $p^+$ type collector region. A field plate effect of the conductor layer enhances the blocking voltage capability of the IGBT. The IGBT further comprises p type forward blocking voltage-improving semiconductor regions, an $n^+$ type channel stopper region, and p type reverse blocking voltage-improving semiconductor regions. On the $n^+$ type channel stopper region, an electrode is disposed for stabilizing the electric potential at this place.

Japanese Unexamined Patent Application Publication No. 2005-252212 discloses another device comprising a MOS gate structure, a $p^+$ isolation region, and a $p^+$ collector layer. The MOS gate structure includes a $p^+$ base layer formed on the surface region of an $n^-$ drift layer, an $n^+$ emitter region formed on the surface region of the $p^+$ base layer, a gate oxide film deposited on the surface of a part of the $p^+$ base layer between the $n^-$ drift layer and the $n^+$ emitter region, and an gate electrode deposited on the gate oxide film. The $p^+$ isolation region is formed surrounding the MOS gate structure via the $n^-$ drift layer and connecting the front-side and backside surfaces of the $n^-$ drift layer. The $p^+$ collector layer is formed on the backside surface of the thinned $n^-$ drift layer and exposing to the backside surface, and in connection with the $p^+$ isolation region. A voltage withstanding structure is formed between an emitter electrode and the $p^+$ isolation region, the emitter electrode being formed on the MOS gate structure.

Several number of field limiting layers and several number of field limiting electrodes are formed towards the $p^+$ isolation region side. In the middle region of the edge termination structure, an intermediate electric field relaxation region is formed.

The technology disclosed in Japanese Unexamined Patent Application Publication No. 2005-101254 must be provided with a structure to prevent the $n^-$ drift region from complete depletion in a conducting state. This is because, upon forward voltage application, a depletion layer expanding from the p channel region in the active region to the $n^-$ drift region may arrive at the p isolation layer in the isolation region and connect the p channel region to the p isolation layer through the depletion layer. Thus, a conducting state takes place at a lower voltage than the intended voltage. Reverse voltage application may also cause the similar problem when a depletion layer expanding from the p isolation layer arrives at the p channel region. However, Patent Document 2 is silent on a structure to solve this problem. The technology of Patent Document 1 also does not describe a detailed construction of a voltage withstanding structure.

On the other hand, Japanese Unexamined Patent Application Publication No. 2006-319218 and Japanese Unexamined Patent Application Publication No. 2005-252212 disclose some structures to solve the above-mentioned problem. For example, a structure, an intermediate channel stopper part 160 as shown in FIG. 5, is disclosed, in which an $n^+$ channel stopper region 161 provided in the $n^-$ drift region 101 obstructs expansion of the depletion layer 171 from the side of the active region 100 on application of a forward voltage and expansion of a depletion layer 172 from the side of the isolation region 130 on application of a reverse voltage.

The intermediate channel stopper part 160 completely separates an edge termination structure for forward bias section 140 in which the depletion layer 171 expands on application of a forward voltage and an edge termination structure for reverse bias section 150 in which the depletion layer 172 expands on application of a reverse voltage interposing the intermediate channel stopper part 160 therebetween. As a result, the $n^-$ drift layer 101 under the intermediate channel stopper part 160 is not depleted, generating a region that cannot contribute to voltage blocking performance of the edge termination structure 120. In addition, the provision of the intermediate channel stopper part 160 elongates the edge termination structure 120 in the direction from the active region 100 towards the peripheral edge of the semiconductor substrate.

A reverse blocking IGBT provided with an intermediate channel stopper part, as described above, generally comprises an edge termination structure for forward bias section and an edge termination structure for reverse bias section. As a result, this type of reverse blocking IGBT tends to have a longer edge termination structure as compared with an IGBT without a reverse blocking structure. This situation remains when the $n^+$ channel stopper region is replaced by a p channel stopper region as well. This increase in a length of the edge termination structure inhibits miniaturization of a reverse blocking IGBT.

SUMMARY

Additional aspects and/or advantages will be set forth in part in the description which follows and, in part, will be apparent from the description, or may be learned by practice of the invention.

An object of embodiments of the present invention is to solve the above problems in the conventional technologies and to provide a semiconductor device in a reduced size. Another object of the invention is to provide a semiconductor device exhibiting a superior blocking voltage capability.

In order to solve the above problems and accomplish the above objects, a semiconductor device of embodiments of the invention according to claim 1 comprises: a semiconductor substrate of a first conductivity type; an isolation region including an isolation layer of a second conductivity type disposed at a side surface of the semiconductor substrate across the semiconductor substrate from a principal surface to the other principal surface; an active region; an edge termination structure disposed between the active region and the isolation region, and encircling the active region, the edge termination structure including a first edge termination structure section disposed in the side of the active region and a second edge termination structure section disposed in the side of the isolation region; a plurality of first semiconductor regions of the second conductivity type formed in the front-side surface region of the semiconductor substrate in the first edge termination structure section and the second edge termination structure section; and a plurality of conductive films in contact with the first semiconductor regions and formed over an interlayer dielectric film that is selectively formed on the front-side surface of the semiconductor substrate. Of the plurality of conductive films, a first conductive film formed in the first edge termination structure section and disposed at the nearest to the isolation region side further extends towards the isolation region side than the first semiconductor region with which the first conductive film is in contact by a first length that is a distance from an edge at the isolation region side of the first semiconductor region with which the first conductive film is in contact to an edge at the isolation region side of the first conductive film. Of the plurality of conductive films, a second conductive film formed in the second edge termination structure section and disposed at the nearest to the active region side further extends towards the active region side than the first semiconductor region with which the second conductive film is in contact by a second length that is a distance from an edge at the active region side of the first semiconductor region with which the second conductive film is in contact to an edge at the active region side of the second conductive film.

A semiconductor device according to claim 2 is the semiconductor device according to claim 1 in which the edge at the isolation region side of the first conductive film extends towards the isolation region side further than any one of the other conductive films.

A semiconductor device according to claim 3 is the semiconductor device according to claim 1 or claim 2 in which the edge at the active region side of the second conductive film extends towards the active region side further than any one of the other conductive films.

A semiconductor device according to claim 4 is the semiconductor device according to any one of claims 1 through 3 in which the first length is larger than the second length.

A semiconductor device according to claim 5 is the semiconductor device according to any one of claims 1 through 4 in which the first semiconductor regions in the first edge termination structure section are so formed that distances between adjacent first semiconductor regions are the wider the first semiconductor regions depart the further from the active region.

A semiconductor device according to claim 6 is the semiconductor device according to any one of claims 1 through 5 in which the first semiconductor regions in the second edge termination structure section are so formed that distances between adjacent first semiconductor regions are the wider the first semiconductor regions depart the further from the isolation region.

A semiconductor device according to claim 7 is the semiconductor device according to any one of claims 1 through 6 in which a width of the second edge termination structure section is smaller than a width of the first edge termination structure section.

A semiconductor device according to claim 8 is the semiconductor device according to any one of claims 1 through 7 in which the first length is at least 25 μm.

A semiconductor device according to claim 9 is the semiconductor device according to any one of claims 1 through 8 in which the second length is at least 15 μm.

A semiconductor device according to claim 10 is the semiconductor device according to any one of claims 1 through 9 in which a channel stopper to stop a depletion layer expanding from the active region side on application of a forward voltage comprises the second conductive film.

A semiconductor device according to claim 11 is the semiconductor device according to any one of claims 1 through 10 in which a channel stopper to stop a depletion layer expanding from the isolation region side on application of a reverse voltage comprises the first conductive film.

According to embodiments of the invention as stated above, the first conductive film in the first voltage withstanding structure section extends towards the isolation region and the second conductive film in the second edge termination structure section extends towards the active region. On application of a forward voltage, the extension of the second conductive film towards the active region side obstructs the expansion of a depletion layer from the active region side in the front part of the second edge termination structure section. On application of a reverse voltage, the extension of the first conductive film towards the isolation region side obstructs the expansion of a depletion layer from the isolation region side in the front part of the first edge termination structure section. Therefore, an intermediate channel stopper part as in the conventional reverse blocking IGBT (see FIG. 5) does not need to be provided any more. As a consequence, the length of the edge termination structure in the direction from the active region towards the peripheral edge of the semiconductor substrate is reduced.

Since the expansion of the depletion layer from the active region side on application of a forward voltage is stopped in the front part of the second edge termination structure section and the expansion of the depletion layer from the isolation region side on application of a reverse voltage is stopped in the front part of the first edge termination structure section, such a region is formed around the boundary between the first edge termination structure section and the second edge termination structure section where a depletion layer expands on application of a forward voltage and a depletion layer expands on application of a reverse voltage as well, thereby eliminating a region suppressing any depletion in a part of the drift region under the edge termination structure. Thus, such a region is created that ensures both forward bias blocking capability and reverse bias blocking capability simultaneously.

Therefore, a semiconductor device of embodiments of the invention has an effect of reduction in size, and in addition, an effect of maintaining a superior bias blocking capability.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF SYMBOLS

1: $n^-$ drift region
2: p channel region
3: $n^+$ emitter region
4: gate insulation film
5: gate electrode
6: interlayer dielectric film
7: emitter electrode
8: p collector region
9: collector electrode
10: active region
20: voltage withstanding structure
30: isolation region
31: p isolation layer
40: forward voltage withstanding structure section
41, 42, 43, 51, 52, 53: field limiting ring (FLR)
44, 45, 46, 54, 55, 56: field plate (FP)
50: reverse voltage withstanding structure section

DESCRIPTION OF EMBODIMENTS

Reference will now be made in detail to the embodiments, examples of which are illustrated in the accompanying drawings, wherein like reference numerals refer to the like elements throughout. The embodiments are described below to explain the present invention by referring to the figures.

Some preferred aspects of the semiconductor device according to embodiments of the present invention will be described in detail in the following with reference to accompanying drawings. In the following description on embodiments of the invention and in the accompanying drawings, similar structures are given the same symbols and description thereon is omitted.

First Embodiment

Figure 1:
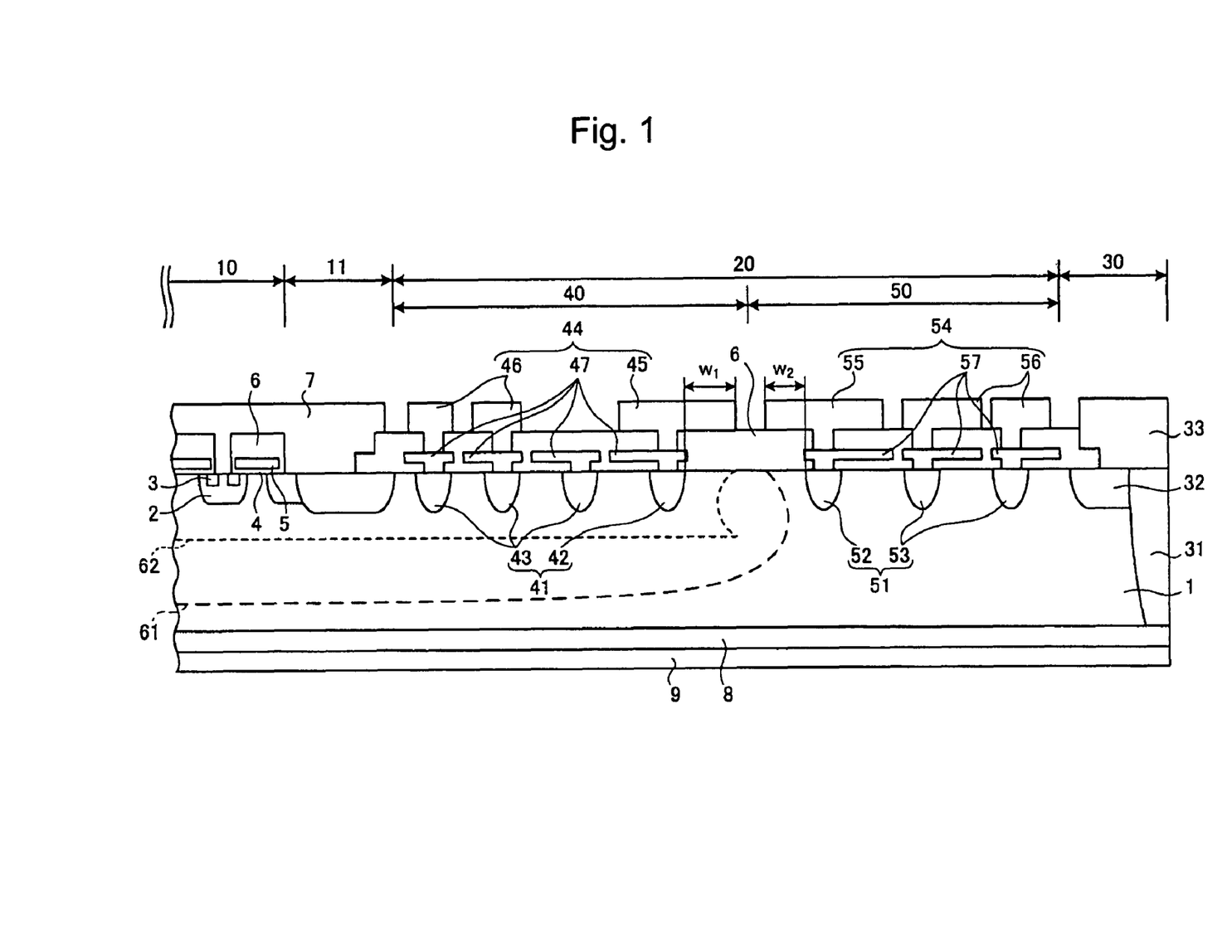
FIG. 1 is a sectional view of a reverse blocking IGBT of a first embodiment according to the present invention.

FIG. 1 is a sectional view of a reverse blocking IGBT of a first embodiment according to the present invention. Referring to FIG. 1, the reverse blocking IGBT comprises an n type semiconductor substrate, an active region 10 constructing an IGBT structure in the surface region of the n type semiconductor substrate, and an isolation region 30 formed on the side surface of the n type semiconductor substrate and electrically isolating the active region 10 from an outer peripheral edge of the n type semiconductor substrate. An edge termination structure 20 is provided between the active region 10 and the isolation region 30 for mitigating an electric field strength at the surface of a pn junction in the IGBT structure to ensure an intended bias blocking capability. The edge termination structure 20 encircles the active region 10. A region 11 can be provided between the active region 10 and the edge termination structure 20 for mitigating electric field concentration at the edge of the active region 10 in a conducting state and for withdrawing carriers in an OFF state.

The active region 10 comprises a p channel region 2 selectively formed in the front-side surface region of an $n^-$ drift region 1, $n^+$ emitter region 3 selectively formed in the surface region of the p channel region 2, and a gate electrode 5 formed via a gate insulation film 4 extending over a surface from the $n^+$ emitter region 3 to a part of the $n^-$ drift layer 1.

An emitter electrode 7 is made in contact with the p channel region 2 and the $n^+$ emitter region 3. The emitter electrode 7 is electrically insulated from the gate electrode 5 with an interlayer dielectric film 6. The interlayer dielectric film 6 is also provided selectively in the place from the edge termination structure 20 to the isolation region 30. A collector region 8 is formed on the backside surface of the n⁻ drift layer 1 over the active region 10 and the isolation region 30. A collector electrode 9 is made in contact with the p collector region 8.

In the isolation region 30, a p isolation layer 31 (a second semiconductor region) is formed on the side surface of the n⁻ drift region 1. The p isolation layer 31 is formed across the n⁻ drift region 1 from the front-side surface to the backside surface, and is in contact with a floating p type region 32 formed in the front-side surface region of the n⁻ drift region 1 and with the p collector region 8 formed on the backside surface of the n⁻ drift region 1. The p isolation layer 31 surrounds the edge termination structure 20. At the outer peripheral edge of the semiconductor substrate, a field plate 33 (an equipotential ring; EQR) is provided on a part of the interlayer dielectric film 6. This EQR 33 is in electrical contact with the p isolation layer 31 and the p type region 32.

The edge termination structure 20 comprises a plurality of field limiting rings (FLRs, first semiconductor regions) 41 and a plurality of FLRs 51 (that are first semiconductor regions as well), the first semiconductor regions being floating p type regions formed in the front-side surface region of the n⁻ drift region 1. The number of FLRs 41 and FLRs 51 shown in FIG. 1 is merely an example and not limited to these numbers; and more FLRs 41 and FLRs 51 can be provided. The interlayer dielectric film 6 covers the front surface of the n⁻ drift layer 1 except for the parts of the surface at the place of the FLRs 41 and FLRs 51. In other words, the interlayer dielectric film 6 has openings at the places of FLRs 41, 51 and the p isolation layer 31.

The FLRs 41 and the FLRs 51 are made in contact with semiconductor films 47 and semiconductor films 57, respectively, which are composed of polysilicon, for example. The semiconductor films 47, 57 are formed in a construction embedded in the interlayer dielectric film 6 and extending into inside of the interlayer dielectric film 6. Field plates (FPs, electrically conductive films) 44 and FPs 54 are made in contact with the FLRs 41 and the FLRs 51 via the semiconductor films 47 and the semiconductor films 57 establishing electrical connection between them. Thus, at the openings in the interlayer dielectric film 6, laminated conductive films of semiconductor films 47 and FPs 44 are in contact with the FLRs 41, and laminated conductive films of semiconductor film 57 and FPs 54 are in contact with the FLRs 51.

Since the FP 44 and the FLR 41 are connected through the semiconductor film 47 that allows contact with the FLR 41 at a minute opening, the contact can be surely accomplished even at a narrow opening in the interlayer dielectric film 6, which is a contact place between the semiconductor film 47 and the FP 44. Therefore, contact between the FLR 41 and the FP 44 is ensured, thereby improving reliability in the edge termination structure of the reverse blocking IGBT. Connection between the FPs 54 and the FLRs 51 via the semiconductor films 57 has the same effect.

Both edges of each of the FPs 44 and 54 are extended over the interlayer dielectric film 6 in the directions towards the active region 10 and the isolation region 30. Distances between the FPs 44, between the outermost of the FPs 44 and the innermost of the FPs 54, and between the FPs 54 have such magnitudes that suppress distortion of equipotential distribution in the n⁻ drift region 1, and preferably as narrow as possible in the manufacturing process. In other words, it is preferable that the parts exposing between the FPs 44 and between the FPs 54 are as little as possible in the manufacturing process. This structure decreases an area without a cover of an electrically conductive film and shields an external electric field with the FPs 44 and the FPs 54, thereby hindering occurrence of electrostatic induction to improve reliability of the reverse blocking IGBT.

The FPs 44 and 54 are covered by a passivation film though not depicted in FIG. 1. Detailed description will be made afterwards on the FLRs 41, 51, the FPs 44, 54, and the semiconductor films 47, 57.

The edge termination structure 20 comprises in the side of the active region 10 a forward edge termination structure for forward bias section (a first edge termination structure section) 40 for ensuring mainly forward bias blocking capability on application of a forward voltage, and an edge termination structure for reverse bias blocking capability section (a second edge termination structure section) 50 for ensuring mainly reverse bias blocking capability on application of a reverse voltage in the side of the isolation region 30. The FLRs 41, the FPs 44 and the semiconductor films 47 are formed in the edge termination structure for forward bias section 40, and the FLRs 51, the FPs 54 and the semiconductor films 57 are formed in the edge termination structure for reverse bias section 50.

The FLRs 41 in the edge termination structure for forward bias section 40 are so disposed that a distance between adjacent FLRs 41 is wider for the FLRs disposed farther from the active region 10. The reason for this construction is as follows. Electric field strength is highest at a position nearest to the active region 10 in the edge termination structure for forward bias section 40 on application of a forward voltage. Consequently the electric field strength can be made approximately uniform among the FLRs 41 by means of such distances between the FLRs 41 that is narrowest at the side of the active region 10 and increases towards the isolation region 30.

The FPs 44 can be provided only at the positions of the FLR 41 nearest to the active region 10, second, fourth, sixth, . . . , (even number-th) FLR 41 from the side of active region 10 and the FLR 41 nearest to the edge termination structure for reverse bias section 50 (a first forward FLR 42). Alternatively, the FPs 44 can be provided only at the positions of the FLRs 41 of first, third, fifth, . . . , (odd number-th) FLR 41 from the side of active region 10, and the first forward FLR 42.

Of the FPs 44, the FP, a first forward FP (a first conductive film) 45, which is in contact with the first forward FLR 42 via the semiconductor film 47, is formed extending towards the side of the isolation region 30. The edge of the first forward FP 45 at the side of the isolation region 30 extends towards the isolation region 30 beyond the edge of the first forward FLR 42 at the side of the isolation region 30. In the description in this specification, a wording "an FP extends towards the side of a region" should be understood that the edge of FP at the side of the region extends beyond the edge of the FLR in contact with the FP at the same side of the region.

The edge of the first forward FP 45 at the side of the isolation region 30 extends towards the side of the isolation region 30 in the largest extent among the FPs 44, 54. For example, an extension length, a first length $w_1$, of the first forward FP 45 towards the side of the isolation region 30 is preferably at least 25 μm, the reason for which will be described afterwards.

The first forward FP 45 is formed extending towards the side of active region 10 as well. The FPs 46 (second forward FPs 46) are in contact with the FLRs 43 (second forward FLRs 43) that are disposed nearer to the side of the active region 10 than the first forward FLR 42. The semiconductor films 47 are interposed between the second FLRs and the second FPs. The FPs 46 extend to the side of the active region 10.

The edge of the semiconductor films 47 at the side of the active region 10 extends towards the side of the active region 10 more than the edge of the extension at the side of the active region 10 of the corresponding first forward FLR 42 or the first forward FLR 43, which is in contact with the semiconductor film 47. Preferably, the edge at the side of the active region 10 of the first forward FP 45 does not extend beyond the edge at the side of the active region 10 of the corresponding semiconductor film 47 which is in contact with the first forward FP 45. Preferably, the edge at the side of the active region 10 and the edge at the side of the isolation region 30 of every second forward FP 46 do not extend beyond the edges at the respective side of the corresponding semiconductor film 47. This configuration allows forming a voltage withstanding structure at a high precision because dimensional precision of the semiconductor film 47 is generally better than that of the FP 46.

The FLRs 51 in the edge termination structure for reverse bias section 50 are so disposed that a distance between adjacent FLRs 51 is wider for the FLRs disposed farther from the isolation region 30. The reason for this construction is as follows. Electric field strength is highest at a position nearest to the isolation region 30 in the edge termination structure for reverse bias section 50 on application of a reverse voltage. Consequently the electric field strength can be made approximately uniform among the FLRs 51 by means of such distances between the FLRs 51 that are narrowest at the side of the isolation region 30 and increases towards the active region 10.

The FPs 54 can be provided only at the positions of the FLR 51 nearest to the isolation region 30 and even number-th FLR 51 from the side of isolation region 30 and the FLR 51 nearest to the edge termination structure for forward bias section 40 (a first reverse FLR 52). Alternatively, the FPs 54 can be provided only at the positions of the odd number-th FLR 51 from the side of isolation region 30 and the first reverse FLR 52.

Of the FPs 54, the FP, a first reverse FP 55 (a second conductive film 55), which is in contact with the first reverse FLR 52 via the semiconductor film 47, is formed extending towards the side of the active region 10. The edge of the first reverse FP 55 at the side of the active region 10 extends towards the side of the active region 10 in the largest extent among the FPs 54 and 44. For example, an extension length, a second length $w_2$, of the first reverse FP 55 towards the side of the active region 10 is preferably at least 15 μm, the reason for which will be described afterwards.

The first reverse FP 55 is formed extending to the side of isolation region 30 as well. The FPs 56 (second reverse FPs 56) are in contact with the FLRs 53 (second reverse FLRs 53) that are disposed nearer to the side of the isolation region 30 than the first reverse FLR 52. The semiconductor films 57 are interposed between the second FLRs and the second FPs. The FPs 56 extend to the side of the isolation region 30.

The edge of the semiconductor films 57 at the side of the isolation region 30 extends towards the side of the isolation region 30 more than the edge of the extension at the side of the isolation region 30 of the corresponding first reverse FLR 52 or the second reverse FLR 53, which is in contact with the semiconductor film 57. Preferably, the edge at the side of the isolation region 30 of the first reverse FP 55 does not extend beyond the edge at the side of the isolation region 30 of the corresponding semiconductor film 57 which is in contact with the first forward FP 55. Preferably, the edge at the side of the isolation region 30 and the edge at the side of the active region 10 of every second forward FP 56 do not extend beyond the edges at the respective side of the corresponding semiconductor film 57. The reason for this configuration is similar to the one for the case of FP 44 of the forward voltage withstanding structure section 40.

Preferably, the first length $w_1$, which is a length of extension of the first forward FP 45 towards the side of the isolation region 30, is larger than the second length $w_2$, which is a length of extension of the first reverse FP 55 towards the side of the active region 10. Since the depletion layer 62 expands from the two places of the p isolation layer 31 and the p collector region 8 on application of a reverse voltage, the depletion layer 62 expands in the n⁻ drift region 1 more easily than the depletion layer 61 that expands from only one place of the p channel region 2 on application of a forward voltage. Thus, the first length $w_1$ is preferably longer than the second length $w_2$.

Preferably, the reverse blocking voltage is designed higher than the forward blocking voltage, because the depletion layer 62 is more easily expands in the n⁻ drift region 1 than the depletion layer 61. Since the edge termination structure for forward bias section 40 and the edge termination structure for reverse bias section 50 have the similar structure, the number of the FLRs 51 can be less than that of the FLRs 41 if the reverse blocking voltage is designed higher than the forward blocking voltage. As a consequence, the length of the edge termination structure of the edge termination structure for reverse bias section 50 along the direction from the active region 10 towards the outer peripheral edge of the semiconductor substrate can be made shorter than the length of the edge termination structure of the edge termination structure for forward bias section 40.

Now, operation of the reverse blocking IGBT as shown in FIG. 1 will be described in the following. The depletion layer 61 starts to expand, on application of a forward voltage, from the pn junction composed of the p channel region 2 and the n⁻ drift region 1. The depletion layer 61 continues to expand across the second forward FLR 43 nearest to the active region 10, the next second forward FLR 43 nearest in the isolation side of this second forward FLR, and the first forward FLR 42 in this sequence. The depletion layer 61 expands towards the side of the isolation region 30 under control by the extending portions towards the side of the active region 10 of the second forward FPs 46, the semiconductor films 47, and the first forward FP 45. Since the depletion layer 61 expands towards the side of the isolation region 30 while controlling the expansion, durability is improved in a device of embodiments of the invention. When the depletion layer 61 reaches the position of isolation region 30 side of the first forward FLR 42, extension of the depletion layer 61 is not hindered anymore but allowed to expand owing to the extension of the first forward FP 45 towards the side of the isolation region 30. This situation improves forward withstand voltage. After that, the extension of the depletion layer 61 is inhibited by the extension of the first reverse FP 55 towards the side of the active region 10 before arriving at the first reverse FLR 52.

When a reverse voltage is applied, the depletion layer 62 expanding from the pn junction among the p isolation layer 31, the p collector region 8, and the n⁻ drift region 1 expands across the second reverse FLR 53 nearest to the isolation region 30, the next second reverse FLR 53, and the first reverse FLR 52. The depletion layer 62 expands towards the side of the active region 10 under control by the extensions of the second reverse FPs 56, the semiconductor films 57 and the first reverse FP 55. This situation improves durability of a device of embodiments of the invention because of the similar reason as described previously on the case of forward voltage application. When the depletion layer 62 reaches the position of active region 10 side of the first reverse FLR 52, the depletion layer 62 is allowed to further expand owing to the extension towards the active region 10 side of the first reverse FP 55. This situation enhances the reverse blocking voltage. After that, the expansion of the depletion layer 62 is inhibited by the extension towards the isolation region 30 side of the first forward FP 45 before arriving at the first forward FLR 42.

In the first embodiment as described above, the first forward FP 45 in the edge termination structure for forward bias section 40 is formed to extend towards the side of the isolation region 30 and the first reverse FP 55 in the edge termination structure for reverse bias region 50 is formed to extend towards the side of the active region 10. On application of a forward voltage, the extension of the first reverse FP 55 at the side of the active region 10 stops expansion of the depletion layer 61 expanding from the active region 10 side in the front part of the edge termination structure for reverse bias section 50. On application of a reverse voltage, the extension of the first forward FP 45 at the side of the isolation region 30 stops expansion of the depletion layer 62 expanding from the isolation region 30 side in the front part of the edge termination structure for forward bias section 40. Consequently, an intermediate channel stopper part (FIG. 5), which is provided in conventional reverse blocking IGBTs, does not need to be provided any more. As a result, a length of the edge termination structure 20 can be reduced by about 10% as compared with the conventional one. Therefore, a size of a reverse blocking IGBT can be reduced. Because on application of a forward voltage, the expansion of the depletion layer 61 expanding from the active region 10 side is stopped in the front part of the edge termination structure for reverse bias section 50 and on application of a reverse voltage, the expansion of the depletion layer 62 expanding from the isolation region 30 side is stopped in the front part of the edge termination structure for forward bias section 40, a region is formed where the depletion layer 61 expands on application of a forward voltage and a depletion layer 62 expands on application of a reverse voltage around the boundary between the edge termination structure for forward bias section 40 and the reverse voltage withstanding structure section 50, thereby eliminating a region of no depletion in the n⁻ drift region 1 under the edge termination structure 20. Thus, a region is formed that performs as a region to ensure a forward blocking voltage and at the same time, as a region to ensure a reverse blocking voltage. Therefore, even if the length of the edge termination structure 20 is decreased by the length of the above mentioned region that performs as a region to ensure a forward blocking voltage and as a region to ensure a reverse blocking voltage, the forward blocking voltage and the reverse blocking voltage are maintained. Thus, the forward blocking voltage and the reverse blocking voltage are maintained and at the same time, size reduction is achieved.

Second Embodiment

Figure 2:
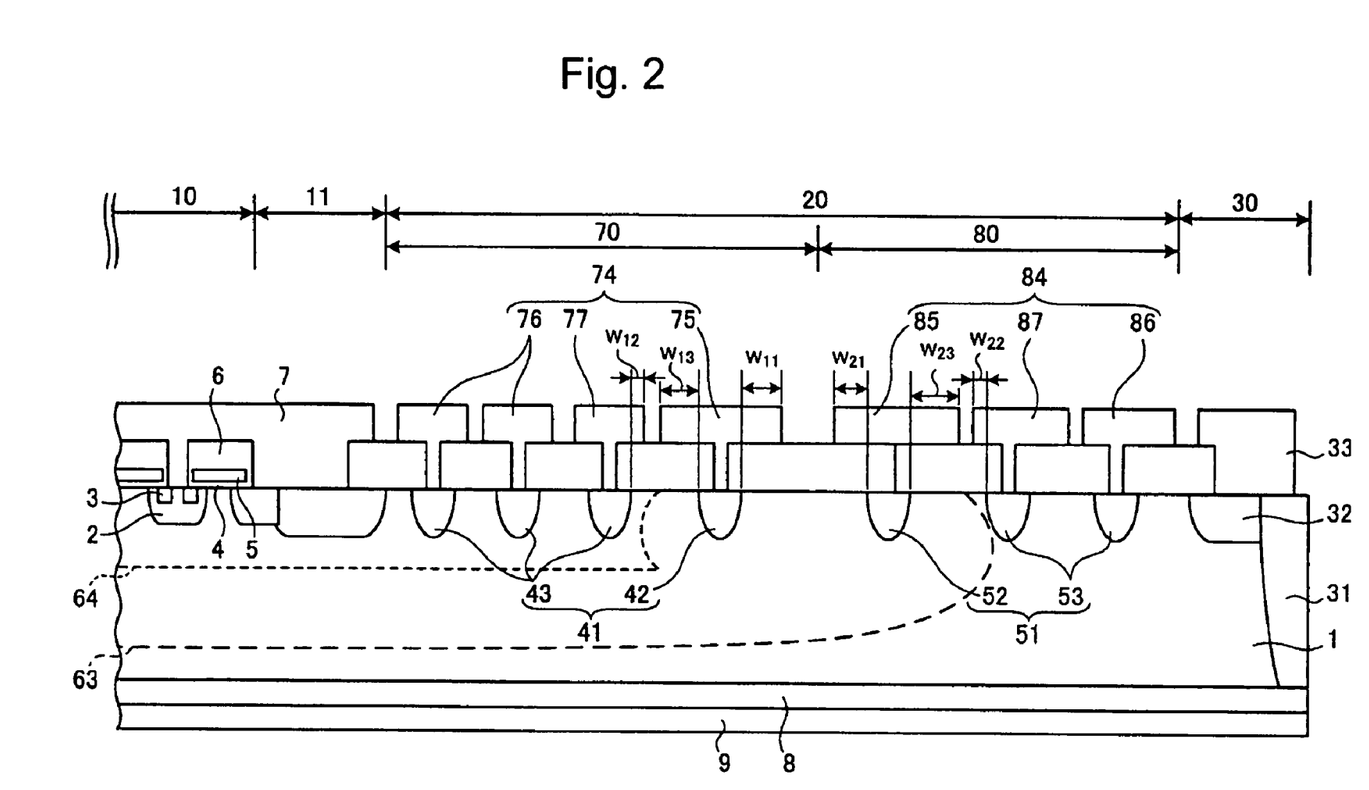
FIG. 2 is a sectional view of a reverse blocking IGBT of a second embodiment according to the present invention.

FIG. 2 is a sectional view of a semiconductor device of a second embodiment. Of the FPs in the first embodiment, the FP adjacent to and in the active region side of the first forward FP can be further extended towards the p isolation region side. The FP adjacent to and in the isolation region side of the first reverse FP can be further extended towards the active region side.

In the second embodiment as shown in FIG. 2, FPs 74 and FPs 84 are in contact with FLRs 41 and FLRs 51 via semiconductor films (not depicted in FIG. 2). Of the FPs 74 in the edge termination structure for forward bias section 70, the FP 75 (a first forward FP 75), which is nearest to the edge termination structure for reverse bias section 80, and the FP 77 (a third forward FP 77), which is adjacent to and in the active region 10 side of the FP 75, are formed extending towards the isolation region 30 side. The extension length (a first length) $w_{11}$ of the first forward FP 75 towards the isolation region 30 side is shorter than the first length $w_1$ of the first forward FP in the first embodiment. The extension length (a third length) $w_{12}$ of the third forward FP 77 towards the isolation region 30 side is shorter than the first length $w_{11}$.

The first forward FP 75 and the third forward FP 77 are formed to extend also to the active region 10 side. The FPs 76 (second forward FPs 76) disposed nearer to the active region 10 side than the third forward FP 77 are formed extending towards the active region 10 side. The extension length (a fourth length $w_{13}$) of the first forward FP 75 towards the active region 10 side is longer than the extension length of the first forward FP 45 in the first embodiment towards the active region 10 side.

Of the FPs 84 in the edge termination structure for reverse bias section 80, the FP 85, which is nearest to the edge termination structure for forward bias section 70 (a first reverse FP 85), and the FP 87, which is adjacent to and in the isolation region 30 side (a third reverse FP 87), are formed extending towards the active region 10 side. The extension length (a second length) $w_{21}$ of the first reverse FP 85 towards the active region 10 side is shorter than the second length $w_2$ of the first reverse FP 55 in the first embodiment. The extension length (a fifth length) $w_{22}$ of the third reverse FP 87 towards the active region 10 side is shorter than the second length $w_{21}$.

The first reverse FP 85 and the third reverse FP 87 are formed to extend also to the isolation region 30 side. The FPs 86 (second reverse FPs 86) disposed nearer to the isolation region 30 side than the third reverse FP 87 are formed extending towards the isolation region 30 side. The extension length (a sixth length $w_{23}$) of the first reverse FP 85 towards the isolation region 30 side is longer than the extension length of the first reverse FP 55 in the first embodiment towards the isolation region 30 side. The structures other than the mentioned ones here are the same as those in the first embodiment.

Now, operation of the reverse blocking IGBT as shown in FIG. 2 will be described in the following. On application of a forward voltage, the extensions towards the active region 10 side of the first reverse FP 85 and the third reverse FP 87 stop the depletion layer 63 expanding from the active region 10 side. The first reverse FP 85 and the third reverse FP 87 function as a channel stopper for stopping the expansion of the depletion layer 63. The position of stopping the expansion of the depletion layer 63 is determined by the second length $w_{21}$, the fifth length $w_{22}$, and the sixth length $w_{23}$. For example, expansion of the depletion layer 63 can be stopped before reaching the second reverse FLR 53 that is in contact with the third reverse FP 87.

On application of a reverse voltage, on the other hand, the extensions towards the isolation region 30 side of the first forward FP 75 and the third forward FP 77 stops the depletion layer 64 expanding from the isolation region 30 side. The first forward FP 75 and the third forward FP 77 function as a channel stopper for stopping the expansion of the depletion layer 64. The position of stopping the expansion of the depletion layer 64 is determined by the first length $w_{11}$, the third length $w_{12}$, and the fourth length $w_{13}$. For example, expansion of the depletion layer 64 can be stopped before reaching the second forward FLR 43 that is in contact with the third forward FP 77. The operation of the reverse blocking IGBT other than the operation mentioned here is the same as that in the first embodiment.

In the above-described reverse blocking IGBT, two FPs are designed to function as a channel stopper in each of the edge termination structure for forward bias section 70 and the edge termination structure for reverse bias section 80. However, three or more FPs or all the FPs can be designed to function as a channel stopper. Moreover, the number of FPs for functioning as a channel stopper can be different between the edge termination structure for forward bias section 70 and the edge termination structure for reverse bias section 80.

All the FPs 74 to function for the channel stopper in the edge termination structure for forward bias section 70 is formed extending towards the isolation region 30 side. Lengths of extension of these FPs 74 towards the active region 10 side are individually adjusted. All the FPs 84 to function for the channel stopper in the edge termination structure for reverse bias section 80 is formed extending towards the active region 10 side. Lengths of extension of these FPs 84 towards the isolation region 30 side are individually adjusted. For example, three FPs 84 in the edge termination structure for reverse bias section 80 are designed to function as a channel stopper on application of a forward voltage, the first reverse FP 85, third reverse FP 87, and in addition, the FP 86 next to the third reverse FP 87 in the isolation region 30 side are extended towards the active region 10 side. The three FSs 84 are formed to extend towards the isolation region 30 side in an amount smaller than that in the FPs 54 of the reverse blocking IGBT shown in FIG. 1.

As described above, the second embodiment has an effect similar to the effect of the first embodiment. Two or more FPs are formed for functioning as a channel stopper on application of a forward voltage and as a channel stopper on application of a reverse voltage. By forming the more number of FPs for functioning a channel stopper, the wider region is obtained where the depletion layer 63 expands on application of a forward voltage and at the same time, the depletion layer 64 expands on application of a reverse voltage, around the boundary between the edge termination structure for forward bias section 70 and the edge termination structure for reverse bias section 80. Thus, such a region can be stretched that ensures both a forward blocking voltage and at the same time, a reverse blocking voltage.

Example 1

Figure 3:
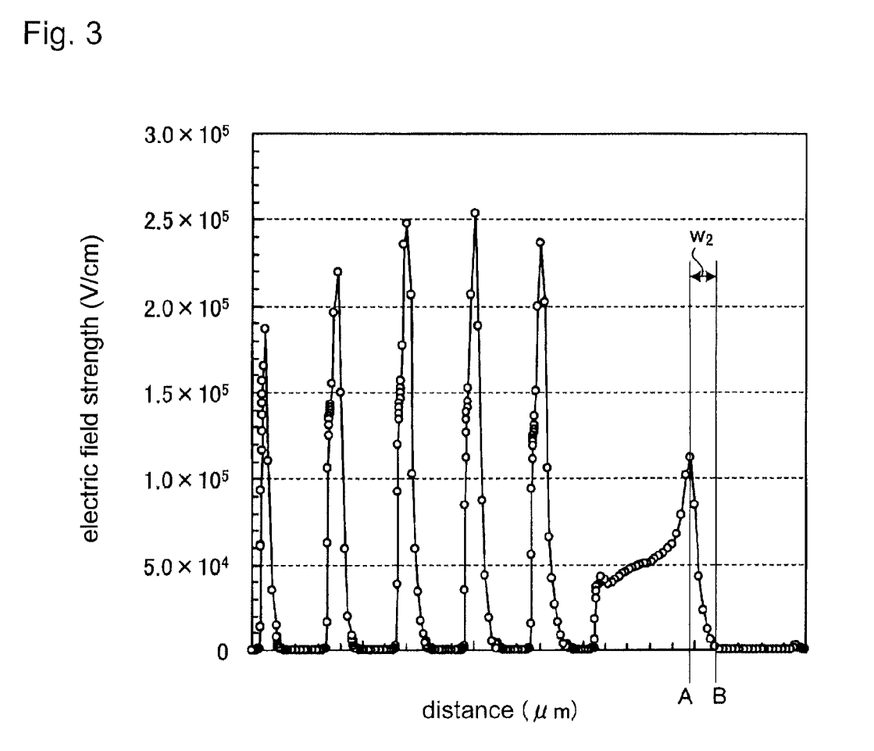
FIG. 3 shows electric characteristics of the voltage withstanding structure on application of a forward voltage in a reverse blocking IGBT according to embodiments of the present invention.

FIG. 3 shows electric characteristics of the edge termination structure on application of a forward voltage. FIG. 3 shows a simulation result of the depletion layer expansion from the active region side on application of a forward voltage. The left side of the abscissa is the active region side of the edge termination structure and the right side of the abscissa is the isolation region side of the edge termination structure. This notation is appropriate in FIG. 4 below, too. For the reverse blocking IGBT according to the first embodiment shown in FIG. 1, depletion layer expansion in the state on application of the maximum forward voltage was calculated for various second length $w_2$, which is an extension length towards the active region side, of the first reverse FP 55. The blocking voltage class is 600 V in this calculation. The peaks of the electric field strength in FIG. 3 correspond to the active region side edges of the FPs. FIG. 3 shows the simulation result for the most favorable second length $w_2$, that is, the minimum value of the second length $w_2$.

The result of FIG. 3 shows that the electric field strength rises in the passage towards the isolation region side and reaches the maximum at the calculation point A, which is the active region side edge of the first reverse FP 55, and falls down to zero at the calculation point B, which is the active region side edge of the first reverse FLR 52. After that, the electric field strength does not increase any more. Thus, it has been demonstrated that the extension of the first reverse FP 55 towards the active region side stops expansion of the depletion layer from the active region side on application of a forward voltage. In this case, the length $w_2$ from the calculation point A to the calculation point B is 15 µm. Therefore, the second length $w_2$ is preferably at least 15 µm.

Example 2

Figure 4:
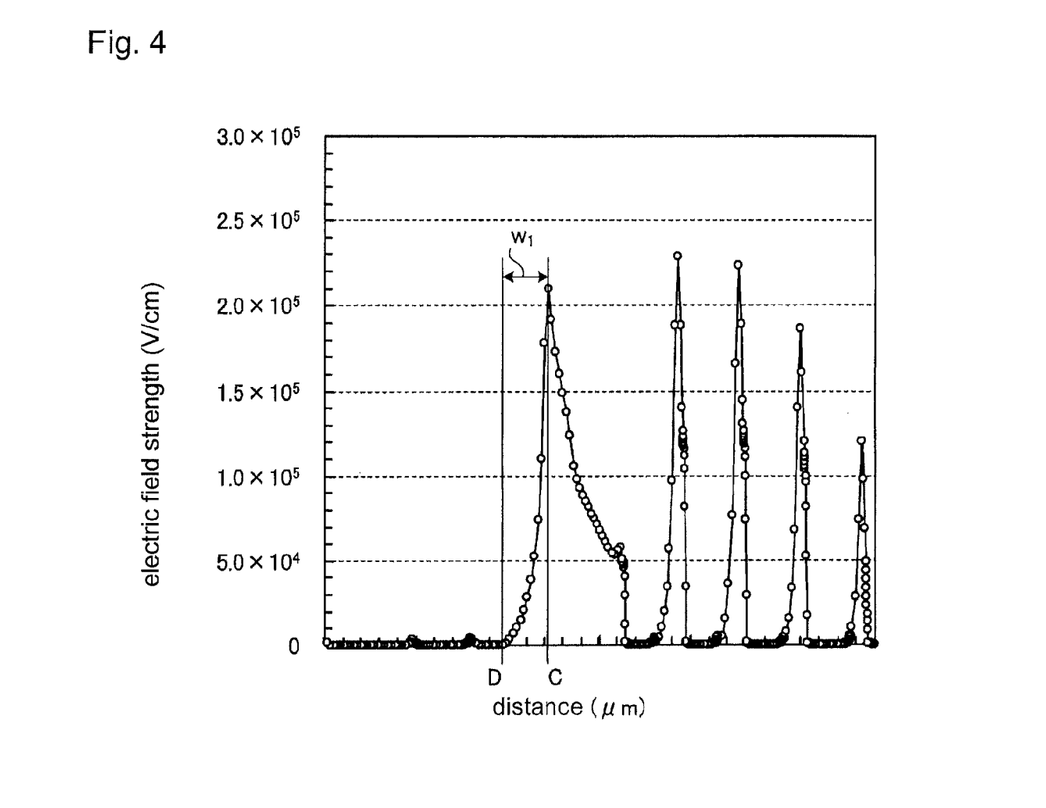
FIG. 4 shows electric characteristics of the voltage withstanding structure on application of a reverse voltage in a reverse blocking IGBT according to embodiments of the present invention.

FIG. 4 shows electric characteristics of the voltage withstanding structure on application of a reverse voltage. FIG. 4 shows a simulation result of the depletion layer expansion from the isolation region side on application of a reverse voltage. For the reverse blocking IGBT according to the first embodiment shown in FIG. 1, depletion layer expansion in the state on application of the maximum reverse voltage was calculated for various first length $w_1$, which is an extension length towards the isolation region side, of the first forward FP 45. The peaks of the electric field strength in FIG. 4 correspond to the isolation region side edges of the FPs. FIG. 4 shows the simulation result for the most favorable first length $w_1$, that is, the minimum value of the second length $w_1$. Other conditions are similar to those in Example 1.

The result of FIG. 4 shows that the electric field strength rises in the passage towards the active region side and reaches the maximum at the calculation point C, which is the isolation region side edge of the first forward FP 45, and falls down to zero at the calculation point D, which is the isolation region side edge of the first forward FLR 42. After that, the electric field strength does not increase any more. Thus, it has been demonstrated that the extension of the first forward FP 45 towards the isolation region side stops expansion of the depletion layer from the isolation region side on application of a reverse voltage. In this case, the length $w_1$ from the calculation point C to the calculation point D is 25 µm. Therefore, the first length $w_1$ is preferably at least 25 µm.

Although the foregoing description for the present invention has been made on embodiment examples of isolated type reverse blocking IGBT, embodiments of the invention can be applied not only to this type of IGBTs but also to any reverse blocking IGBT that has a structure separating an active region from an outer peripheral edge of the semiconductor substrate, for example to a mesa type reverse clocking IGBT. The outer peripheral part can be tilted with a recessed part formed from the rear surface of the semiconductor substrate. The distances between adjacent FLRs in the description are simply examples and the FLRs can be arranged with appropriate distances that attain the intended withstand voltage. A construction is possible in which every p type region and n type region are exchanged.

As described thus far, a semiconductor device according to embodiments of the invention is useful for semiconductor devices requiring blocking capability against both forward and reverse voltages, for example, switches used in a direct conversion circuit such as a matrix converter.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
a semiconductor substrate of a first conductivity type;
an isolation region including an isolation layer of a second conductivity type disposed at a side surface of the semiconductor substrate across the semiconductor substrate from a principal surface to the other principal surface;
an active region;
an edge termination structure disposed between the active region and the isolation region, and encircling the active region, the edge termination structure including a first voltage edge termination section disposed in the side of the active region and a second edge termination structure section disposed in the side of the isolation region;
a plurality of first semiconductor regions of the second conductivity type formed in the front surface region of the semiconductor substrate in the first edge termination structure section and the second edge termination structure section; and
a plurality of conductive films in contact with the first semiconductor regions and formed over an interlayer dielectric film that is selectively formed on the front surface of the semiconductor substrate, wherein
of the plurality of conductive films, a first conductive film formed in the first edge termination structure section and disposed at the nearest to the isolation region side further extends towards the isolation region side than the first semiconductor region with which the first conductive film is in contact by a first length that is a distance from an edge at the isolation region side of the first semiconductor region with which the first conductive film is in contact to an edge at the isolation region side of the first conductive film, and
of the plurality of conductive films, a second conductive film formed in the second edge termination structure section and disposed at the nearest to the active region side further extends towards the active region side than the first semiconductor region with which the second conductive film is in contact by a second length that is a distance from an edge at the active region side of the first semiconductor region with which the second conductive film is in contact to an edge at the active region side of the second conductive film.

2. The semiconductor device according to claim 1, wherein the edge at the isolation region side of the first conductive film extends towards the isolation region side further than any one of the other conductive films.

3. The semiconductor device according to claim 1, wherein the edge at the active region side of the second conductive film extends towards the active region side further than any one of the other conductive films.

4. The semiconductor device according to claim 1, wherein the first length is larger than the second length.

5. The semiconductor device according to claim 1, wherein the first semiconductor regions in the first edge termination structure section are so formed that distances between adjacent first semiconductor regions are the wider the first semiconductor regions depart the further from the active region.

6. The semiconductor device according to claim 1, wherein the first semiconductor regions in the second edge termination structure section are so formed that distances between adjacent first semiconductor regions are the wider the first semiconductor regions depart the further from the isolation region.

7. The semiconductor device according to claim 1, wherein a width of the second edge termination structure section is smaller than a width of the first edge termination structure section.

8. The semiconductor device according to claim 1, wherein the first length is at least 25 µm.

9. The semiconductor device according to claim 1, wherein the second length is at least 15 µm.

10. The semiconductor device according to claim 1, wherein
a channel stopper to stop a depletion layer expanding from the active region side on application of a forward voltage comprises the second conductive film.

11. The semiconductor device according to claim 1, wherein
a channel stopper to stop a depletion layer expanding from the isolation region side on application of a reverse voltage comprises the first conductive film.

12. The semiconductor device according to claim 2, wherein
the edge at the active region side of the second conductive film extends towards the active region side further than any one of the other conductive films.

13. The semiconductor device according to claim 2, wherein
the first length is larger than the second length.

14. The semiconductor device according to claim 2, wherein
the first semiconductor regions in the first edge termination structure section are so formed that distances between adjacent first semiconductor regions are the wider the first semiconductor regions depart the further from the active region.

15. The semiconductor device according to claim 2, wherein
the first semiconductor regions in the second edge termination structure section are so formed that distances between adjacent first semiconductor regions are the wider the first semiconductor regions depart the further from the isolation region.

16. The semiconductor device according to claim 2, wherein
a width of the second edge termination structure section is smaller than a width of the first edge termination structure section.

17. The semiconductor device according to claim 2, wherein
the first length is at least 25 µm.

18. The semiconductor device according to claim 2, wherein
the second length is at least 15 µm.

19. The semiconductor device according to claim 2, wherein
a channel stopper to stop a depletion layer expanding from the active region side on application of a forward voltage comprises the second conductive film.

20. The semiconductor device according to claim 2, wherein
a channel stopper to stop a depletion layer expanding from the isolation region side on application of a reverse voltage comprises the first conductive film.

* * * * *